US011121683B2

(12) United States Patent
Toyomura

(10) Patent No.: US 11,121,683 B2
(45) Date of Patent: Sep. 14, 2021

(54) RADIO-FREQUENCY CIRCUIT AND COMMUNICATION DEVICE

(71) Applicant: Murata Manufacturing Co., Ltd., Kyoto (JP)

(72) Inventor: Takahisa Toyomura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 22 days.

(21) Appl. No.: 16/747,636

(22) Filed: Jan. 21, 2020

(65) Prior Publication Data

US 2020/0153398 A1     May 14, 2020

Related U.S. Application Data

(63) Continuation of application No. PCT/JP2018/026305, filed on Jul. 12, 2018.

(30) Foreign Application Priority Data

Jul. 25, 2017  (JP) .............................. JP2017-143997

(51) Int. Cl.
*H03F 3/191*  (2006.01)
*H03F 3/24*  (2006.01)
(Continued)

(52) U.S. Cl.
CPC ............... *H03F 3/245* (2013.01); *H03F 3/68* (2013.01); *H03G 3/3042* (2013.01); *H03F 3/195* (2013.01); *H03F 2200/451* (2013.01)

(58) Field of Classification Search
CPC ............... H03F 3/68; H03F 3/72; H03F 3/191
(Continued)

(56) References Cited

U.S. PATENT DOCUMENTS

2002/0086650 A1* 7/2002 Haapoja ................... H03F 1/02
                                                            455/120
2002/0090974 A1   7/2002 Hagn
(Continued)

FOREIGN PATENT DOCUMENTS

JP    2002-185356 A    6/2002
JP    2010-192969 A    9/2010
JP    2013-131825 A    7/2013

OTHER PUBLICATIONS

International Search Report for International Application No. PCT/JP2018/026305 dated Oct. 2, 2018.
(Continued)

*Primary Examiner* — Steven J Mottola
(74) *Attorney, Agent, or Firm* — Pearne & Gordon LLP

(57) ABSTRACT

A radio-frequency circuit includes a power amplifier circuit, a first switch, a duplexer, a second switch, a capacitor element, and a controller. The first switch includes a first common terminal and first selection terminals. An output signal of the power amplifier circuit is applied to the first common terminal. The duplexer is a filter connected at one terminal to the first selection terminal. The second switch includes a second common terminal and plural second selection terminals. The plural second selection terminals includes the second selection terminal connected to the other terminal of the duplexer. The capacitor element is built in the first switch. The controller controls the gain of the power amplifier circuit in accordance with a monitor signal obtained via the capacitor element so as to regulate the maximum output level of the power amplifier circuit.

15 Claims, 3 Drawing Sheets

(51) Int. Cl.
*H03F 3/68* (2006.01)
*H03G 3/30* (2006.01)
*H03F 3/195* (2006.01)

(58) Field of Classification Search
USPC .......................................... 330/51, 295, 306
See application file for complete search history.

(56) References Cited

U.S. PATENT DOCUMENTS

2013/0250820 A1    9/2013  Khlat
2019/0280660 A1*   9/2019  Falagan Bobillo ..... H03F 3/245

OTHER PUBLICATIONS

Written Opinion for International Application No. PCT/JP2018/026305 dated Oct. 2, 2018.

* cited by examiner

PRIOR ART

RADIO-FREQUENCY CIRCUIT AND COMMUNICATION DEVICE

This is a continuation of International Application No. PCT/JP2018/026305 filed on Jul. 12, 2018 which claims priority from Japanese Patent Application No. 2017-143997 filed on Jul. 25, 2017. The contents of these applications are incorporated herein by reference in their entireties.

BACKGROUND

Technical Field

The present disclosure relates to a radio-frequency circuit and a communication device.

Hitherto, in radio-frequency devices, such as communication devices, various radio-frequency circuits or a module having radio-frequency circuits mounted thereon are used. For example, Patent Document 1 discloses a radio-frequency power amplifier module that performs power detection.

FIG. 5 is a circuit block diagram illustrating an example of the configuration of the radio-frequency power amplifier module disclosed in Patent Document 1. The radio-frequency power amplifier module HPAMID includes radio-frequency power amplifiers HPA1 and HPA2, a power detecting circuit block DETBK, and capacitors C1 and C2. The radio-frequency power amplifiers HPA1 and HPA2 amplify power of different frequency bands (low band and high band) of signals. Output from HPA1 is coupled to input into DETBK via C1, while output from HPA2 is coupled to input into DETBK via C2. HPA1 and C1 are formed on the same semiconductor chip, while HPA2 and C2 are formed on the same semiconductor chip.

The capacitor C1 couples output from the radio-frequency power amplifier HPA1 with input into the power detecting circuit block DETBK by AC coupling. The capacitor C2 couples output from the radio-frequency power amplifier HPA2 with input into the power detecting circuit block DETBK by AC coupling. DETBK receives an input detection signal obtained via C1 or C2 and outputs a detection voltage signal corresponding to the input level of the input detection signal. An automatic power control circuit APC controls the gain of HPA1 or HPA2 via BIASCTL such that the voltage level of the detection voltage signal and that of a power instruction signal Vramp received from an external terminal coincide with each other.

Patent Document 1: Japanese Unexamined Patent Application Publication No. 2013-131825

BRIEF SUMMARY

Typically, an antenna load as seen from a radio-frequency circuit is changed from moment to moment in accordance with environments where a communication device is used. For example, a portable communication device, such as a cellular phone, may be used in various environments, such as on a metal plate like a table and near the body of a user, where the antenna load is considerably different. If the antenna load is abruptly changed, the voltage level of a transmit signal output from a power amplifier circuit rises to a level exceeding the withstand voltage of filters (including a transmit filter forming a duplexer) disposed at a stage subsequent to the power amplifier circuit. This may lead to a breakdown of the filters.

The present disclosure provides a radio-frequency circuit that prevents a breakdown of a filter disposed at a stage subsequent to a power amplifier circuit by detecting the voltage level of a transmit signal to be applied to the filter with high precision.

A radio-frequency circuit according to an aspect of the present disclosure includes a power amplifier circuit, a first switch, a filter, a second switch, a capacitor element, and a controller. The gain of the power amplifier circuit is controllable. The first switch includes a first common terminal and plural first selection terminals. An output signal of the power amplifier circuit is applied to the first common terminal. One terminal of the filter is connected to one of the plural first selection terminals. The second switch includes a second common terminal and plural second selection terminals. The plural second selection terminals include a second selection terminal connected to the other terminal of the filter. The capacitor element is built in the first switch. The controller controls the gain of the power amplifier circuit in accordance with a monitor signal obtained via the capacitor element so as to regulate the maximum output level of the power amplifier circuit.

The radio-frequency circuit according to the present disclosure can detect the voltage level of an output signal of the power amplifier circuit via the capacitor element built in the first switch so as to detect the voltage level of a transmit signal to be applied to the filter with high precision. It is thus possible to obtain a radio-frequency circuit that can prevent a breakdown of a filter by effectively regulating the output level of a power amplifier circuit such that the voltage level of a transmit signal to be applied to the filter does not exceed the withstand voltage of the filter.

In one aspect of the present disclosure, a radio-frequency circuit comprises: a power amplifier circuit; a first switch having a first common terminal, a first selection terminal, and a monitor terminal, the first common terminal being connected to the power amplifier circuit and being selectively connected to the first selection terminal; a filter having first and second terminals, the first terminal being connected to the first selection terminal; a second switch having a second selection terminal and a second common terminal, the second selection terminal being connected to the second terminal of the filter, and the second common terminal being selectively connected to the second selection terminal; a capacitive element in the first switch, the capacitive element being connected to the monitor terminal; and a controller connected to the monitor terminal.

In one aspect of the present disclosure, the controller is configured to control a gain of the power amplifier circuit in accordance with a monitor signal obtained from the monitor terminal in a manner that maximizes an output level of the power amplifier circuit.

In one aspect of the present disclosure, the capacitive element is connected to the first common terminal.

In one aspect of the present disclosure, the capacitive element is connected to the first selection terminal.

In one aspect of the present disclosure, the first switch further has a third selection terminal and a second monitor terminal, the first common terminal being selectively connected to the third selection terminal, the controller is further connected to the second monitor terminal, and the radio-frequency circuit further comprises a second capacitive element in the first switch, the second capacitive element being connected to the third selection terminal and to the second monitor terminal.

In one aspect of the present disclosure, a communication device comprises: a first power amplifier circuit and a second power amplifier circuit; first switch having a first common terminal, a third common terminal, a first selection terminal, a first monitor terminal, and a second monitor terminal, the first common terminal being connected to the first power amplifier circuit and being selectively connected to the first selection terminal, and the third common terminal being connected to the second power amplifier circuit; a filter having first and second terminals, the first terminal being connected to the first selection terminal; a second switch having a second selection terminal and a second common terminal, the second selection terminal being connected to the second terminal of the filter, the second common terminal being selectively connected to the second selection terminal; a first capacitive element in the first switch, the first capacitive element being connected to the first common terminal and to the first monitor terminal; a second capacitive element in the first switch, the first capacitive element being connected to the third common terminal and to the second monitor terminal; and a controller connected to the first monitor terminal and to the second monitor terminal In one aspect of the present disclosure, a communication device comprises: the radio-frequency circuit according to one aspect of the present disclosure; and an RF signal processing circuit connected to the radio-frequency circuit.

DETAILED DESCRIPTION

Embodiments of the present disclosure will be described below in detail with reference to the drawings. All of the embodiments described below illustrate general or specific examples. Numeric values, shapes, materials, components, and positions and connection states of the components illustrated in the following embodiments are only examples, and are not described for limiting the present disclosure. Among the components illustrated in the following embodiments, the components that are not recited in the independent claims will be described as optional components.

First Embodiment

A radio-frequency circuit according to a first embodiment is a multiband radio-frequency front-end circuit that supports FDD (frequency division duplexing) communication in each of two frequency bands.

Figure 1:
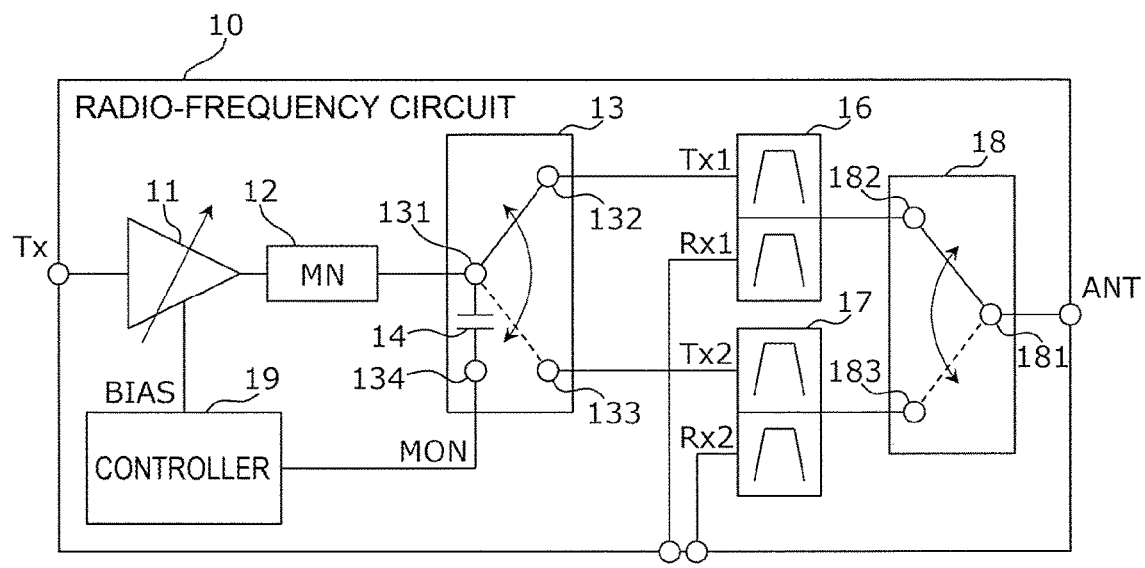
FIG. 1 is a circuit diagram illustrating an example of the configuration of a radio-frequency circuit according to a first embodiment.

FIG. 1 is a circuit diagram illustrating an example of the configuration of a radio-frequency circuit according to the first embodiment. A radio-frequency circuit 10 shown in FIG. 1 includes a power amplifier circuit 11, a matching circuit 12, a first switch 13, a capacitor element 14, duplexers 16 and 17, a second switch 18, and a controller 19.

The power amplifier circuit 11 is an amplifier circuit that amplifies a transmit signal Tx of the transmit frequency band with variable gain. As an example, the power amplifier circuit 11 is constituted by an amplifying element, such as a hetero bipolar transistor. The gain of the power amplifier circuit 11 is controlled in accordance with a bias signal BIAS supplied from the controller 19.

One terminal of the matching circuit 12 is connected to the output terminal of the power amplifier circuit 11. The matching circuit 12 performs matching of the transmit signal received from the power amplifier circuit 11 and supplies the transmit signal to the first switch 13.

The first switch 13 is an SPDT (single-pole double-throw) switch including a first common terminal 131 and two first selection terminals 132 and 133. The first common terminal 131 is connected to the other terminal of the matching circuit 12. The first common terminal 131 is electrically connected to the power amplifier circuit 11 through the matching circuit 12. In accordance with a control signal, which is not shown, the first switch 13 connects the first common terminal 131 to one of the first selection terminals 132 and 133 corresponding to the frequency band used for communication. As an example, the first switch 13 may be implemented by an integrated circuit chip in which a switch circuit constituted by a metal oxide semiconductor transistor is formed on a silicon substrate.

The capacitor element 14 is built in the first switch 13. As an example, the capacitor element 14 may be implemented by an MIM (metal-insulator-metal) structure on a silicon substrate.

One terminal of the capacitor element 14 is connected to the first common terminal 131, and the other terminal is connected to a monitor terminal 134. The first common terminal 131 and the monitor terminal 134 are electrically coupled with each other via the capacitor element 14. A monitor signal MON corresponding to the transmit signal Tx applied to the first common terminal 131 is output at the monitor terminal 134. The monitor signal MON represents the voltage level of an output signal of the power amplifier circuit 11.

The duplexer 16, which is constituted by a transmit filter and a receive filter, combines a transmit signal Tx1 in the transmit band of a first frequency band and a receive signal Rx1 in the receive band of the first frequency band or separates the transmit signal Tx1 and the receive signal Rx1 from each other. The transmit filter of the duplexer 16 has two terminals (e.g., first terminal and second terminal). One terminal of the transmit filter of the duplexer 16 is connected to the first selection terminal 132.

The duplexer 17, which is constituted by a transmit filter and a receive filter, combines a transmit signal Tx2 in the transmit band of a second frequency band and a receive signal Rx2 in the receive band of the second frequency band or separates the transmit signal Tx2 and the receive signal Rx2 from each other. One terminal of the transmit filter of the duplexer 17 is connected to the first selection terminal 133.

The second switch 18 is an SPDT (single-pole double-throw) switch including a second common terminal 181 and two second selection terminals 182 and 183. The second selection terminal 182 is connected to the other terminal of the transmit filter of the duplexer 16. The second selection terminal 183 is connected to the other terminal of the transmit filter of the duplexer 17. In accordance with a control signal, which is not shown, the second switch 18 connects the second common terminal 181 to one of the selection terminals 182 and 183 corresponding to the frequency band used for communication. As an example, the second switch 18 may be implemented by an integrated circuit chip in which a switch circuit constituted by a metal oxide semiconductor transistor is formed on a silicon substrate.

As a result of the first switch 13 and the second switch 18 operating together, a signal path is formed for the duplexer 16 or 17 to select a signal of the frequency band used for communication. The capacitor element 14 is built, not in the second switch 18, but in the first switch 13, which is located farther upstream than the duplexers 16 and 17 in the flow direction of an output signal of the power amplifier circuit 11.

The controller 19 controls the gain of the power amplifier circuit 11 in accordance with the monitor signal MON, thereby regulating the maximum output level of the power amplifier circuit 11. More specifically, the controller 19 regulates the voltage level of an output signal of the power amplifier circuit 11, which is represented by the monitor signal MON, such that the voltage level does not exceed a predetermined threshold provided in accordance with the withstand voltage of the transmit filters of the duplexers 16 and 17. That is, the controller 19 reduces the gain of the power amplifier circuit 11 by adjusting the bias signal BIAS, thereby regulating the output level of the power amplifier circuit 11.

In the radio-frequency circuit 10 configured as described above, an output signal of the power amplifier circuit 11 is monitored (for example, the voltage level is detected) via the capacitor element 14 built in the first switch 13. The capacitor element 14 is built in the first switch 13, which is located farther upstream than the duplexers 16 and 17 in the flow direction of an output signal (that is, a transmit signal) of the power amplifier circuit 11. The capacitor element 14 is thus able to highly precisely detect the voltage level of a transmit signal to be applied to the transmit filters of the duplexers 16 and 17. Using the capacitor element 14 to monitor an output signal of the power amplifier circuit 11 achieves a smaller insertion loss than using a coupler.

As a result of monitoring an output signal of the power amplifier circuit 11 with a small insertion loss and with high precision, the output level of the output signal can effectively be regulated. Hence, the voltage level of a transmit signal to be applied to the transmit filters does not exceed the withstand voltage of the transmit filters, thereby preventing a breakdown of the transmit filters.

Additionally, the single capacitor element 14 connected to the first common terminal 131 can detect the output level of the power amplifier circuit 11. It is thus possible to reduce the size of the first switch 13 to be smaller than the configuration in which a capacitor element is disposed near the first selection terminals 132 and 133.

Second Embodiment

As in the radio-frequency circuit 10 according to the first embodiment, a radio-frequency circuit according to a second embodiment is a multiband radio-frequency front-end circuit that supports FDD communication in each of two frequency bands.

Figure 2:
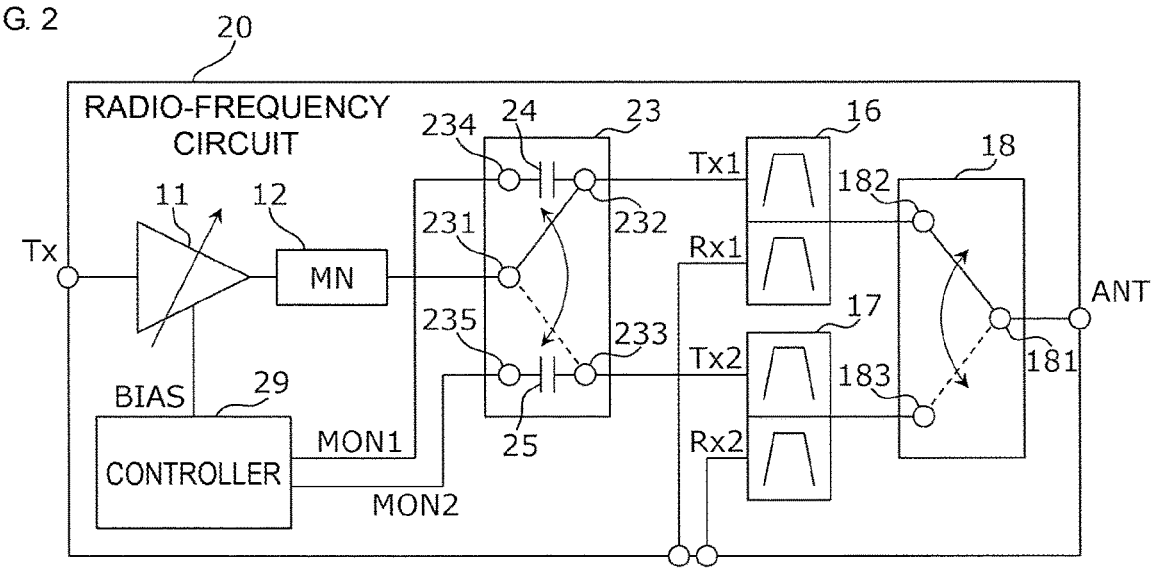
FIG. 2 is a circuit diagram illustrating an example of the configuration of a radio-frequency circuit according to a second embodiment.

FIG. 2 is a circuit diagram illustrating an example of the configuration of a radio-frequency circuit according to the second embodiment. A radio-frequency circuit 20 shown in FIG. 2 is configured such that the first switch 13 and the controller 19 of the radio-frequency circuit 10 shown in FIG. 1 are replaced by a first switch 23 and a controller 29, respectively. Hereinafter, the second embodiment will be described mainly by referring to points different from the first embodiment while omitting an explanation of the same points.

The first switch 23 is an SPDT (single-pole double-throw) switch including a first common terminal 231 and two first selection terminals 232 and 233. The first common terminal 231 is connected to the other terminal of the matching circuit 12. In accordance with a control signal, which is not shown, the first switch 23 connects the first common terminal 231 to one of the first selection terminals 232 and 233 corresponding to the frequency band used for communication.

Capacitor elements 24 and 25 are built in the first switch 23. As an example, the capacitor elements 24 and 25 may be implemented by an MIM structure on a silicon substrate.

One terminal of the capacitor element 24 is connected to the first selection terminal 232, and the other terminal is connected to a monitor terminal 234. The first selection terminal 232 and the monitor terminal 234 are electrically coupled with each other via the capacitor element 24. A monitor signal MON1 corresponding to a transmit signal Tx1 output from the first selection terminal 232 is output at the monitor terminal 234. The monitor signal MON1 represents the voltage level of an output signal of the power amplifier circuit 11. In one embodiment, the monitor terminal 234 is built in the first switch and is connected to the capacitor element.

One terminal of the capacitor element 25 is connected to the first selection terminal 233, and the other terminal is connected to a monitor terminal 235. The first selection terminal 233 and the monitor terminal 235 are electrically coupled with each other via the capacitor element 25. A monitor signal MON2 corresponding to a transmit signal Tx2 output from the first selection terminal 233 is output at the monitor terminal 235. The monitor signal MON2 represents the voltage level of an output signal of the power amplifier circuit 11.

The controller 29 is connected to the monitor terminals 234 and 235. The controller 29 controls the gain of the power amplifier circuit 11 in accordance with the monitor signals MON1 and MON2, thereby regulating the maximum output level of the power amplifier circuit 11.

More specifically, the controller 29 compares the voltage level of an output signal of the power amplifier circuit 11, which is represented by the monitor signal MON1, with a predetermined threshold provided in accordance with the withstand voltage of the transmit filter of the duplexer 16. If the voltage level of the output signal is higher than the threshold, the controller 29 reduces the gain of the power amplifier circuit 11 by adjusting the bias signal BIAS, thereby regulating the output level of the power amplifier circuit 11.

The controller 29 also compares the voltage level of an output signal of the power amplifier circuit 11, which is represented by the monitor signal MON2, with a predetermined threshold provided in accordance with the withstand voltage of the transmit filter of the duplexer 17. If the voltage level of the output signal is higher than the threshold, the controller 29 reduces the gain of the power amplifier circuit 11 by adjusting the bias signal BIAS, thereby regulating the output level of the power amplifier circuit 11.

In the radio-frequency circuit 20 configured as described above, as a result of detecting the voltage level of an output signal of the power amplifier circuit 11 via each of the capacitor elements 24 and 25 built in the first switch 23, the output level of a transmit signal to be applied to the transmit filter of each of the duplexers 16 and 17 can be detected with high precision.

In particular, in the radio-frequency circuit 20, the capacitor elements 24 and 25 are disposed near the input terminals of the duplexers 16 and 17, respectively. The voltage levels of the transmit signals Tx1 and Tx2 to be input into the transmit filters of the duplexers 16 and 17 can thus be detected with higher precision.

Hence, the output level of the power amplifier circuit 11 can be more effectively regulated, and the voltage level of a transmit signal to be applied to each of the transmit filters does not exceed the withstand voltage of the transmit filter, thereby preventing a breakdown of the transmit filters more reliably.

Third Embodiment

A radio-frequency circuit according to a third embodiment is a multiband radio-frequency front-end circuit that supports FDD communication in each of two frequency bands included in a first frequency band group and each of two frequency bands included in a second frequency band group.

Figure 3:
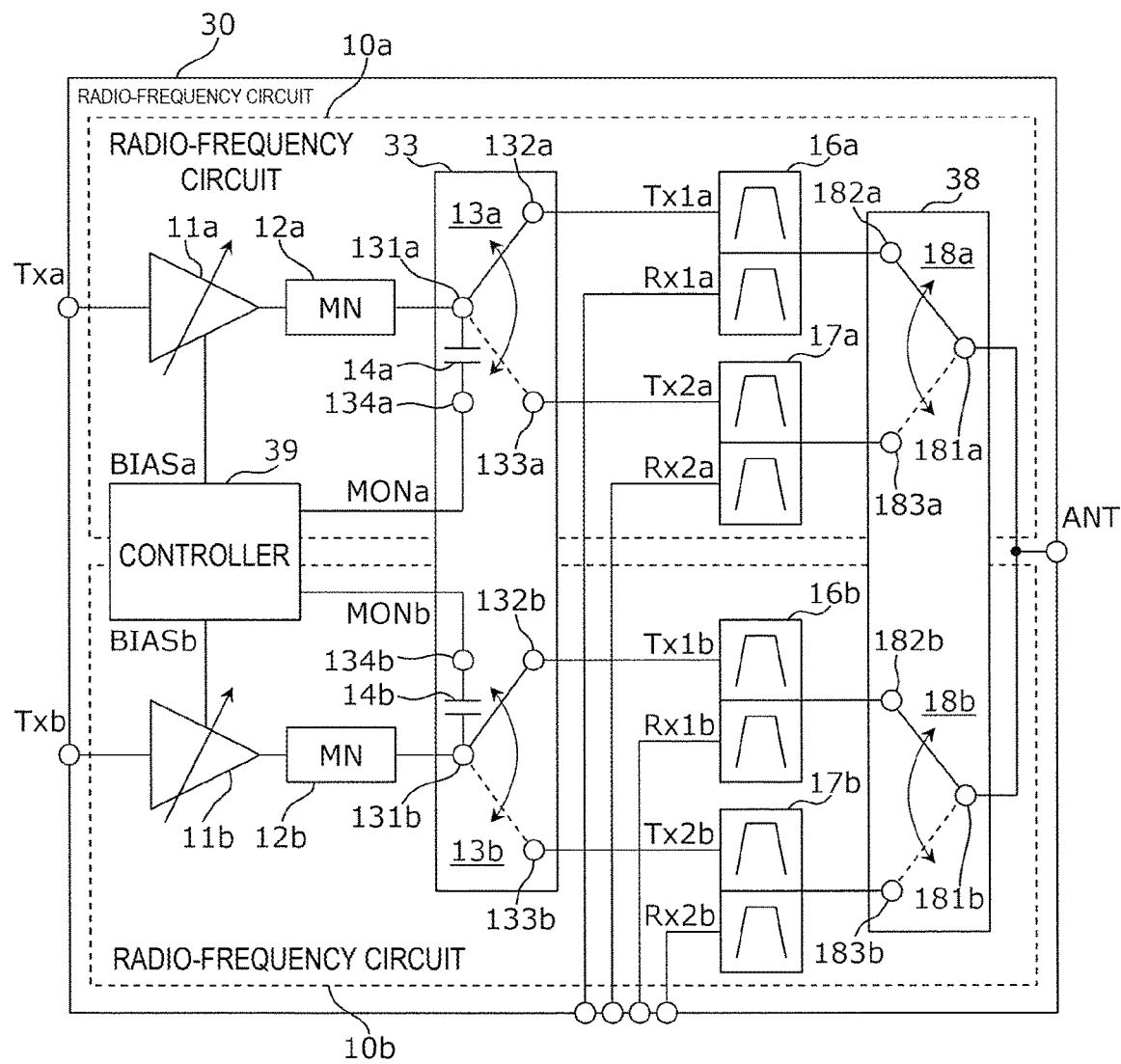
FIG. 3 is a circuit diagram illustrating an example of the configuration of a radio-frequency circuit according to a third embodiment.

FIG. 3 is a circuit diagram illustrating an example of the configuration of a radio-frequency circuit according to the third embodiment. A radio-frequency circuit 30 shown in FIG. 3 includes two circuit sets each equivalent to the radio-frequency circuit 10 shown in FIG. 1, as indicated by the frames in the broken lines. The first switches 13, the second switches 18, and the controllers 19 of the two circuit sets are integrated into a first switch 33, a second switch 38, and a controller 39, respectively. In FIG. 3, the elements corresponding to those of the radio-frequency circuit 10 shown in FIG. 1 are designated by like reference numerals appended with the alphabetical character "a" or "b" for identifying the circuit set (e.g., a power amplifier circuit 11a and a power amplifier circuit 11b, a first common terminal 131a, a second common terminal 181a, third common terminal 131b, and a fourth common terminal 181b, and so on). The first common terminal 131a is electrically connected to a first power amplifier circuit 11a. The second common terminal 131b is electrically connected to a second amplifier circuit 11b. A first capacitor element 14a is connected to the first common terminal 131a. A second capacitor terminal 14b is connected to the third common terminal 131b. A first monitor terminal 134a is connected to the first capacitor element 14a. A second monitor terminal 134b is connected to the second capacitor element 14b.

In the radio-frequency circuit 30, as a result of operating the radio-frequency circuits 10a and 10b at the same time, carrier aggregation communication can be performed by the simultaneous use of one of the frequency bands of the first frequency band group and one of the frequency bands of the second frequency band group.

In the radio-frequency circuit 30 configured as described above, each of the radio-frequency circuits 10a and 10b achieves the advantages obtained by the radio-frequency circuit 10 discussed in the first embodiment.

Fourth Embodiment

In a fourth embodiment, a communication device including the radio-frequency circuit according to one of the first through third embodiments will be described.

Figure 4:
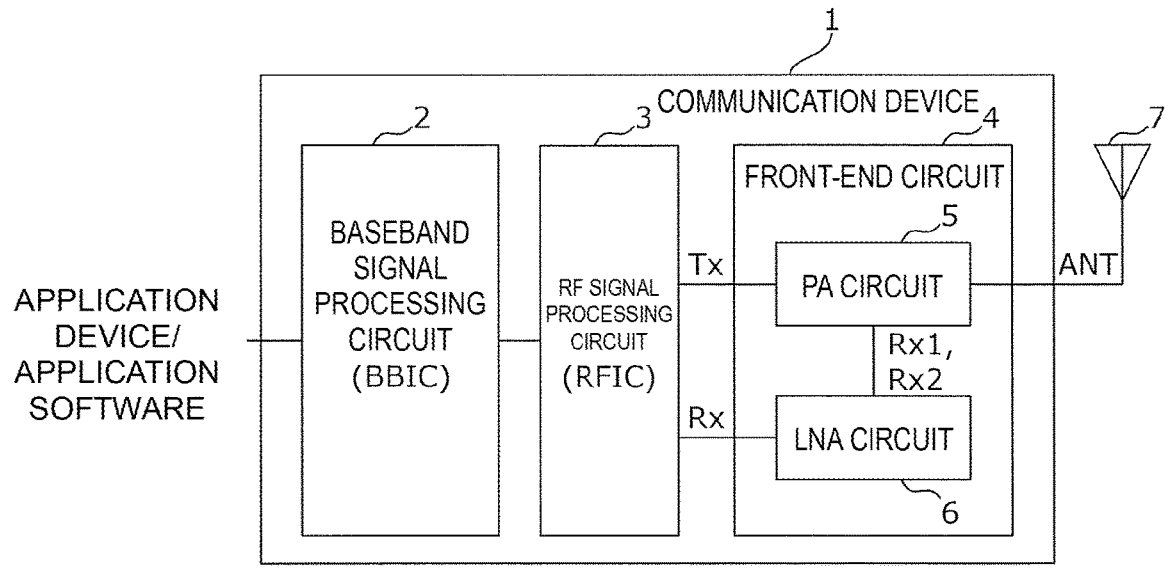
FIG. 4 is a functional block diagram illustrating an example of the configuration of a communication device according to a fourth embodiment.
Figure 5:
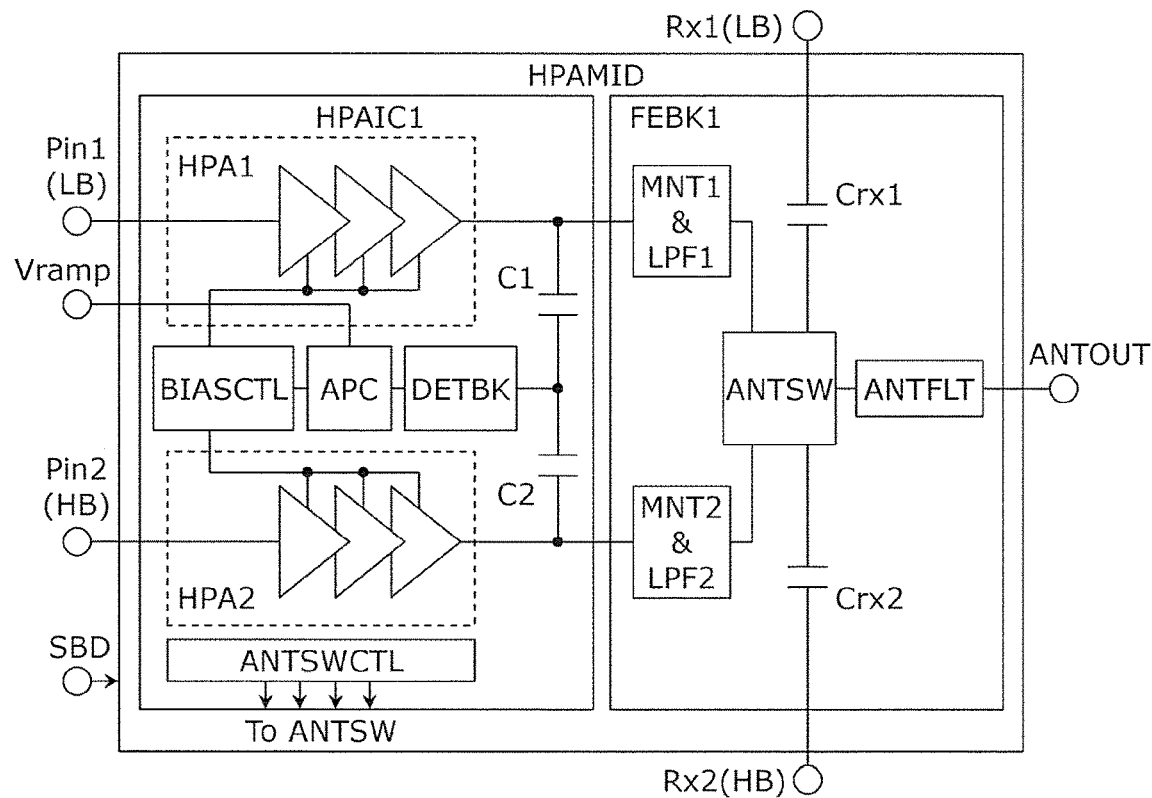
FIG. 5 is a circuit block diagram illustrating an example of the configuration of a radio-frequency power amplifier module according to the related art.

FIG. 4 is a block diagram illustrating an example of the functional configuration of a communication device according to the fourth embodiment. A communication device 1 shown in FIG. 4 includes a baseband signal processing circuit 2, an RF signal processing circuit 3, and a front-end circuit 4.

The baseband signal processing circuit 2 converts transmit data generated by an application device/application software, which performs voice communication and image display, into a transmit signal, and supplies it to the RF signal processing circuit 3. This conversion processing may include data compression, data multiplexing, and adding of error correcting code. The baseband signal processing circuit 2 also converts a received signal received from the RF signal processing circuit 3 into received data and supplies it to the application device/application software. This conversion processing may include data decompression, data demultiplexing, and error correction. The baseband signal processing circuit 2 may be constituted by a baseband integrated circuit (BBIC).

The RF signal processing circuit 3 converts a transmit signal received from the baseband signal processing circuit 2 into a transmit signal Tx and supplies it to the front-end circuit 4. This conversion processing may include modulation and up-conversion of the signal. The RF signal processing circuit 3 also converts a received signal Rx received from the front-end circuit 4 into a received signal and supplies it to the baseband signal processing circuit 2. This conversion processing may include demodulation and down-conversion of the signal. The RF signal processing circuit 3 may be constituted by a radio-frequency integrated circuit (RFIC).

The front-end circuit 4 includes a PA (power amplifier) circuit 5 and an LNA (low-noise amplifier) circuit 6.

The PA circuit 5 is electrically connected to the RF signal processing circuit 3. The PA circuit 5 amplifies a transmit signal Tx obtained from the RF signal processing circuit 3, combines it with an antenna signal ANT, and supplies the antenna signal ANT to an antenna 7. The PA circuit 5 also separates received signals Rx1 and Rx2 of the individual frequency bands from an antenna signal ANT obtained from the antenna 7, and supplies the received signals Rx1 and Rx2 to the LNA circuit 6. As the PA circuit 5, one of the radio-frequency circuits 10, 20, and 30 discussed in the first through third embodiments is used. The antenna 7 may be included in the communication device 1.

Upon receiving the received signals Rx1 and Rx2 supplied from the PA circuit 5, the LNA circuit 6 amplifies one of the received signals Rx1 and Rx2 having the frequency band used for communication and supplies the amplified signal to the RF signal processing circuit 3 as a received signal Rx.

If the radio-frequency circuit 30 is used as the PA circuit 5, the transmit signal Tx includes transmit signals Txa and Txb, and the received signal Rx includes received signals Rxa and Rxb, the received signal Rx1 includes received signals Rx1a and Rx1b, and the received signal Rx2 includes received signals Rx2a and Rx2b.

In the communication device 1 configured as described above, one of the radio-frequency circuits 10, 20, and 30 is used as the PA circuit 5. It is thus possible to obtain a high-reliability communication device 1 that prevents a breakdown of transmit filters of duplexers by highly precisely detecting the voltage level of a transmit signal to be applied to each of the transmit filters.

CONCLUSIONS

A radio-frequency circuit according to an aspect of the present disclosure includes a power amplifier circuit, a first switch, a filter, a second switch, a capacitor element, and a controller. The gain of the power amplifier circuit is controllable. The first switch includes a first common terminal and plural first selection terminals. An output signal of the power amplifier circuit is applied to the first common terminal. One terminal of the filter is connected to one of the plural first selection terminals. The second switch includes a second common terminal and plural second selection terminals. The plural second selection terminals include a second selection terminal connected to the other terminal of the filter. The capacitor element is built in the first switch. The controller controls the gain of the power amplifier circuit in accordance with a monitor signal obtained via the capacitor element so as to regulate the maximum output level of the power amplifier circuit.

With this configuration, as a result of detecting the voltage level of an output signal of the power amplifier circuit via the capacitor element built in the first switch, the voltage level of a transmit signal to be applied to the filter can be detected with high precision. It is thus possible to prevent a breakdown of the filter by effectively regulating the output level of the power amplifier circuit such that the voltage level of a transmit signal to be applied to the filter does not exceed the withstand voltage of the filter.

The capacitor element may be connected to the first common terminal.

With this configuration, the single capacitor element connected to the first common terminal can detect the output level of the power amplifier circuit. It is thus possible to reduce the size of the first switch to be smaller than the configuration in which a capacitor element is disposed near the first selection terminals.

The capacitor element may be connected to, among the plural first selection terminals, the first selection terminal to which the filter is connected.

With this configuration, as a result of disposing the capacitor element near the input terminal of the filter, the voltage level of a transmit signal to be input into the filter can be detected with higher precision.

The power amplifier circuit may include a first power amplifier circuit and a second power amplifier circuit. The gain of each of the first and second power amplifier circuits is controllable. The first switch may include two first common terminals. An output signal of the first power amplifier circuit may be applied to one of the two first common terminals, while an output signal of the second power amplifier circuit may be applied to the other one of the two first common terminals. The capacitor element may include a first capacitor element and a second capacitor element. The first capacitor element may be connected to one of the two first common terminals, while the second capacitor element may be connected to the other one of the two first common terminals. The controller may control the gain of the first power amplifier circuit in accordance with a first monitor signal obtained via the first capacitor element so as to regulate the maximum output level of the first power amplifier circuit. The controller may also control the gain of the second power amplifier circuit in accordance with a second monitor signal obtained via the second capacitor element so as to regulate the maximum output level of the second power amplifier circuit.

With this configuration, in the radio-frequency circuit including the two power amplifier circuits which individually output transmit signals, as a result of detecting the voltage levels of the transmit signals with high precision and effectively regulating the output levels of the power amplifier circuits, a breakdown of the filters can be prevented.

A communication device according to an aspect of the present disclosure includes the above-described radio-frequency circuit and an RF signal processing circuit connected to the radio-frequency circuit.

With this configuration, by using the radio-frequency circuit that can prevent a breakdown of a filter as a result of detecting the voltage level of a transmit signal to be applied to the filter with high precision and effectively regulating the output level of each power amplifier circuit, a high-reliability communication device can be obtained.

The radio-frequency circuits and the communication device according to the embodiments of the present disclosure have been discussed. However, the present disclosure is not restricted to the above-described embodiments. Modified examples obtained by making various modifications to the above-described embodiments by those skilled in the art and other embodiments implemented by combining certain elements in some of the embodiments without necessarily departing from the scope and spirit of the disclosure may also be encompassed in one or plural aspects of the present disclosure.

INDUSTRIAL APPLICABILITY

The present disclosure finds widespread application in various communication devices as a radio-frequency circuit.

REFERENCE SIGNS LIST 1 communication device
2 baseband signal processing circuit
3 RF signal processing circuit
4 front-end circuit
5 PA circuit
6 LNA circuit
7 antenna
10, 10a, 10b, 20, 30 radio-frequency circuit
11 power amplifier circuit
12 matching circuit
13, 23, 33 first switch
14, 24, 25 capacitor element
16, 17 duplexer
18, 38 second switch
19, 29, 39 controller
131, 231 first common terminal
132, 133, 233, 234 first selection terminal
134, 234, 235 monitor terminal
181 second common terminal
182, 183 second selection terminal

The invention claimed is:

1. A radio-frequency circuit comprising:
a power amplifier circuit;
a first switch having a first common terminal, a first selection terminal, and a monitor terminal, the first common terminal being connected to the power amplifier circuit and being selectively connected to the first selection terminal;
a filter having first and second terminals, the first terminal being connected to the first selection terminal;
a second switch having a second selection terminal and a second common terminal, the second selection terminal being connected to the second terminal of the filter, and the second common terminal being selectively connected to the second selection terminal;
a capacitive element in the first switch, the capacitive element being connected to the monitor terminal; and
a controller connected to the monitor terminal.

2. The radio-frequency circuit according to claim 1, wherein the controller is configured to control a gain of the power amplifier circuit in accordance with a monitor signal obtained from the monitor terminal in a manner that maximizes an output level of the power amplifier circuit.

3. The radio-frequency circuit according to claim 1, wherein the capacitive element is connected to the first common terminal.

4. The radio-frequency circuit according to claim 2, wherein the capacitive element is connected to the first common terminal.

5. The radio-frequency circuit according to claim 1, wherein the capacitive element is connected to the first selection terminal.

6. The radio-frequency circuit according to claim 2, wherein the capacitive element is connected to the first selection terminal.

7. The radio-frequency circuit according to claim 5, wherein:
the first switch further has a third selection terminal and a second monitor terminal, the first common terminal being selectively connected to the third selection terminal,
the controller is further connected to the second monitor terminal, and
the radio-frequency circuit further comprises a second capacitive element in the first switch, the second capacitive element being connected to the third selection terminal and to the second monitor terminal.

8. The radio-frequency circuit according to claim 6, wherein:
the first switch further has a third selection terminal and a second monitor terminal, the first common terminal being selectively connected to the third selection terminal,
the controller is further connected to the second monitor terminal, and
the radio-frequency circuit further comprises a second capacitive element in the first switch, the second capacitive element being connected to the third selection terminal and to the second monitor terminal.

9. A radio-frequency circuit comprising:
a first power amplifier circuit and a second power amplifier circuit;
a first switch having a first common terminal, a third common terminal, a first selection terminal, a first monitor terminal, and a second monitor terminal, the first common terminal being connected to the first power amplifier circuit and being selectively connected to the first selection terminal, and the third common terminal being connected to the second power amplifier circuit;
a filter having first and second terminals, the first terminal being connected to the first selection terminal;
a second switch having a second selection terminal and a second common terminal, the second selection terminal being connected to the second terminal of the filter, the second common terminal being selectively connected to the second selection terminal;
a first capacitive element in the first switch, the first capacitive element being connected to the first common terminal and to the first monitor terminal;
a second capacitive element in the first switch, the first capacitive element being connected to the third common terminal and to the second monitor terminal; and
a controller connected to the first monitor terminal and to the second monitor terminal.

10. A communication device comprising:
the radio-frequency circuit according to claim 1; and
an RF signal processing circuit connected to the radio-frequency circuit.

11. A communication device comprising:
the radio-frequency circuit according to claim 2; and
an RF signal processing circuit connected to the radio-frequency circuit.

12. A communication device comprising:
the radio-frequency circuit according to claim 3; and
an RF signal processing circuit connected to the radio-frequency circuit.

13. A communication device comprising:
the radio-frequency circuit according to claim 5; and
an RF signal processing circuit connected to the radio-frequency circuit.

14. A communication device comprising:
the radio-frequency circuit according to claim 7; and
an RF signal processing circuit connected to the radio-frequency circuit.

15. A communication device comprising:
the radio-frequency circuit according to claim 9; and
an RF signal processing circuit connected to the radio-frequency circuit.

* * * * *